US007795799B2

(12) United States Patent  (10) Patent No.: US 7,795,799 B2
Mishima  (45) Date of Patent: Sep. 14, 2010

(54) LIGHT-EMITTING DEVICE

(75) Inventor: Masayuki Mishima, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 09/845,356

(22) Filed: May 1, 2001

(65) Prior Publication Data

US 2001/0053462 A1 Dec. 20, 2001

(30) Foreign Application Priority Data

May 2, 2000 (JP) ............... P- 2000-133530

(51) Int. Cl.
*H01L 51/50* (2006.01)
(52) U.S. Cl. ............... 313/504; 313/506; 428/690; 428/917; 257/E51.044
(58) Field of Classification Search ............... 428/690, 428/917, 212, 332; 313/504, 506; 257/102, 257/103
See application file for complete search history.

(56) References Cited

U.S. PATENT DOCUMENTS

| 5,283,132 | A | | 2/1994 | Ogura et al. | |
|---|---|---|---|---|---|
| 5,294,810 | A | * | 3/1994 | Egusa et al. | 257/40 |
| 6,097,147 | A | | 8/2000 | Baldo et al. | 313/506 |
| 6,310,360 | B1 | * | 10/2001 | Forrest et al. | 257/40 |
| 2001/0019782 | A1 | * | 9/2001 | Igarashi et al. | 428/690 |
| 2001/0028962 | A1 | * | 10/2001 | Hirai | 428/690 |
| 2002/0034656 | A1 | * | 3/2002 | Thompson et al. | 428/690 |
| 2002/0074935 | A1 | * | 6/2002 | Kwong et al. | 313/504 |
| 2002/0197511 | A1 | * | 12/2002 | D'Andrade et al. | 428/690 |

FOREIGN PATENT DOCUMENTS

| JP | 4-284395 A | | 10/1992 |
|---|---|---|---|
| JP | 07-142169 A | * | 6/1995 |
| JP | 9-63770 A | | 3/1997 |
| JP | 10-3990 A | | 1/1998 |
| JP | 11-329734 A | | 11/1999 |
| WO | WO 00/57676 | | 9/2000 |

OTHER PUBLICATIONS

J. Kido et al., "Multilayer White Light-Emitting Organic Electroluminescent Device", Science, vol. 267, pp. 1332-1334 (Mar. 1995).*
Machine-assisted translation of JP 07-142169 A (Jun. 1995).*
M. A. Baldo et al., Very High-Efficiency Green Organic Light-Emitting Devices Based on Electrophosphorescence, Appl. Phys. Ltrs., vol. 75, No. 1, (Jul. 5, 1999), pp. 4-6.
Tetsuo Tsutsui et al., High Quantum Efficiency in Organic Light-Emitting Devices with Iridium-Complex as a Triplet Emissive Center, Jpn. J. Appl. Phys., vol. 38, No. 12B, (Dec. 15, 1999), pp. L1502-L1504 .
D. F. O'Brien et al., Electrophosphoresence from a Doped Polymer Light Emitting Diode, Synthetic Metals 116, (2001), pp. 379-383.
Chihaya Adachi et al., High-Efficiency Red Electrophosphorescence Devices, Appl. Phys. Ltrs., vol. 78, No. 11, (Mar. 12, 2001), pp. 1622-1624.

* cited by examiner

*Primary Examiner*—Marie R. Yamnitzky
(74) *Attorney, Agent, or Firm*—Sughrue Mion, PLLC

(57) ABSTRACT

A light-emitting device which can effectively be utilized as a surface light source for a full-color display, a back light or an illumination light source, or as a light source array in a printer, which shows an excellent light-emitting efficiency and light-emitting luminance, and which is particularly excellent as a white light source showing an excellent light-emitting efficiency and light-emitting luminance. The light-emitting device comprises a substrate having provided thereon at least an anode, an organic compound layer including a light-emitting layer, and a cathode, in which the light-emitting layer contains two or more different kinds of light-emitting materials, with at least one of the light-emitting materials being an orthometallated complex.

10 Claims, No Drawings

LIGHT-EMITTING DEVICE

FIELD OF THE INVENTION

This invention relates to a light-emitting device, which can effectively be utilized as a surface light source for a full-color display, a back light or an illumination light source, or as a light source array for a printer. More particularly, it relates to a light-emitting device excellent in light-emitting efficiency and light-emitting luminance.

BACKGROUND OF THE INVENTION

Organic light-emitting devices using organic substances seem to have a bright prospect as solid, light-emitting inexpensive devices for large-area full color displays or as light source arrays for recording, and many developments have been made on them. The organic light-emitting devices are generally constituted by a light-emitting layer interleaved between a pair of opposed electrodes. Light emission is a phenomenon which occurs when electrons and holes are respectively injected from the cathode and the anode upon application of an electric field across the electrodes, and are recombined in the light-emitting layer and their energy level returns from conduction band to valence band with emitting the energy as light.

Conventional organic light-emitting devices have required a high driving voltage, with providing a low light-emitting luminance and a low light-emitting efficiency. In recent years, however, various techniques have been reported to solve the problems. For example, there is known an organic light-emitting device having an organic thin film formed by vapor deposition of an organic compound (*Applied Physics Letters*, vol. 51, p.913, 1987). The organic light-emitting device described there has a two-layered structure of an electron transporting layer comprising an electron transporting material and a hole transporting layer comprising a hole transporting material, and shows a markedly improved light-emitting performance in comparison with conventional single-layered devices.

The organic light-emitting device described above uses a low molecular amine compound as a hole transporting material and an Al complex of 8-quinolinol (Alq) as an electron transporting and light-emitting material, with the color of emitted light being green. After the report, a number of such vapor deposition type organic light-emitting devices have been reported (see references described in Macromolecular Symposium, vol. 125, p. 1, 1997).

However, the organic light-emitting devices involve a serious problem of an extremely low light-emitting efficiency in comparison with inorganic LED devices or fluorescent tubes. Most of the presently proposed organic light-emitting devices utilize fluorescent light emission obtained from singlet excitons of organic compound light-emitting materials. Based on the simple mechanism of quantum chemistry, the ratio of singlet excitons generating fluorescence to triplet excitons generating phosphorescence in number is 1:3. Hence, as long as fluorescence is utilized, only 25% of the generated excitons can be effectively utilized, thus light-emitting efficiency being unavoidably low. On the other hand, if phosphorescence obtained from the triplet excitons can be utilized, it serves to improve light-emitting efficiency. Under such idea, a phosphorescence-emitting device using an iridium-phenylpyridine complex has recently been reported (*Applied Physics Letter*, vol. 75, p. 4, 1999; *Japanese Journal of Applied Physics*, vol. 38, p.L1502, 1999). In these reports, the light-emitting devices are reported to show light-emitting efficiency 2 to 3 times as much as that of conventional fluorescence-utilizing organic light-emitting devices. However, they are still poor in saving energy or durability, and much more improvement of light-emitting efficiency and luminance have eagerly been demanded.

On the other hand, in the field of light sources for back light and illumination, there has been a strong demand for a light source which shows a high light-emitting efficiency and a high light-emitting luminance, but at present there are no better ones than fluorescent tubes. Fluorescent tubes containing mercury are causing the problem of environmental pollution and, in addition, they lack flexibility and impose limitation as to a place to provide then. Further, they have a problem of short life of as short as 10000 hours or shorter. In order to solve these problems, there have been proposed organic light-emitting devices having enough safety and enough thin thickness, which, however, are still inferior in light-emitting efficiency and light-emitting luminance. Thus, improvement in this regard has eagerly been desired.

SUMMARY OF THE INVENTION

The present invention has been made for solving the problem with the related art and attaining the following objects. That is, the invention provides a light-emitting device which can effectively be utilized as a surface light source for a full color display, a back light or an illumination light source, or as a light source array in a printer and which shows an excellent light-emitting efficiency and light-emitting luminance. Further, it provides a white light-emitting device showing an excellent light-emitting efficiency and light-emitting luminance.

The above-described subject of the invention can be solved by the following light-emitting devices.

(1) A light-emitting device comprising a substrate (support) having provided thereon at least an anode, an organic compound layer including at least one light-emitting layer, and a cathode, in which the light-emitting layer contains two or more different kinds of light-emitting materials, with at least one of the light-emitting materials being an orthometallated complex.

(2) The light-emitting device as described in (1), wherein the two or more different kinds of light-emitting materials are contained in the same light-emitting layer.

(3) The light-emitting device as described in (1), wherein the two or more different kinds of light-emitting materials are contained in different light-emitting layers.

(4) The light-emitting device as described in (1) to (3), which emits a white light.

(5) The light-emitting device as described in (1) to (4), wherein three different light-emitting materials are used, with a first one being a blue light-emitting material having a light-emitting wavelength peak in the range of 400 to 500 nm, a second one being a green light-emitting material having a light-emitting wavelength peak in the range of 500 to 570 nm, and the other one being a red light-emitting material having a light-emitting wavelength peak in the range of 580 to 670 nm.

DETAILED DESCRIPTION OF THE INVENTION

The light-emitting device in the invention comprises a substrate having provided thereon at least an anode, an organic compound layer including at least light-emitting layer, and a cathode and contains two or more different kinds of light-emitting materials in the light-emitting layer, with at least one of the light-emitting materials being an orthometallated complex.

The term "orthometallated complexes" to be used as light-emitting materials in the invention is a general term for a group of compounds described in, for example, "Yuki Kinzoku Kagaku—Kiso to Oyo—", p.150 and p.232 (published by Shokabo-Sha in 1982) and "Photochemistry and Photophysics of Coordination Compounds" written by H. Yersin (published by Springer-Verlag Co. in 1987). As ligands capable of forming the orthometallated complexes, there are various ones as described in the above literature. For example, there may be illustrated 2-phenylpyridine derivatives, 7,8-benzoquinoline derivatives, 2-(2-thienyl)pyridine derivatives, 2-(1-naphthyl)pyridine derivatives and 2-phenylquinoline derivatives These derivatives may have a substituent or substituents when necessary. As metals capable of forming the orthometallated complexes, there may be illustrated Ir, Pd and Pt, which, however, are not limitative at all. The orthometallated complexes to be used in the invention may have other ligands (for example, amines such as a dialkylamine and a diarylamine) than the ligands necessary for forming the complexes.

The characteristic feature of the invention is to incorporate two or more different kinds of light-emitting materials in the light-emitting layer, with at least one of the orthometallated complexes being contained in the light-emitting layer.

Another light-emitting material or materials may or may not be the orthometallated complex(es) and may be exemplified by benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, perylene derivatives, oxadiazole derivatives, aldazine derivatives, pyralidine derivatives, pyran derivatives, pyrene derivatives, cyclopentadiene derivatives, bis-styrylanthracene derivatives, quinacridone derivatives, pyrrolopyridine derivatives, thiadiazolopyridine derivatives, styrylamine derivatives, aromatic dimethylidene compounds or various metal complexes represented by metal complexes or rare earth complexes of 8-quinolinol derivatives, and high molecular compounds such as polythiophene derivatives, polyphenylene derivatives, polyphenylenevinylene derivatives and polyfluorene derivatives, though not being limited to these.

In the invention, a light-emitting device capable of emitting any color light can be obtained by using two, three or more different kinds of light-emitting materials at least one of which is the above-described orthometallated complex. Particularly, a white light-emitting device showing a high light-emitting efficiency and a high light-emitting luminance can be obtained by properly selecting the light-emitting materials. For example, a combination of a blue light-emitting material and an orange light-emitting material can provide a white light-emitting device. It is particularly preferred to properly select three different kinds of light-emitting materials, with a first one being a blue light-emitting material having a light-emitting wavelength in the range of 400 to 500 nm, a second one being a green light-emitting material having a light-emitting wavelength in the range of 500 to 570 nm, and the other one being a red light-emitting material having a light-emitting wavelength in the range of 580 to 670 nm. By incorporating these materials in a light-emitting layer of the organic compound layer, a white light-emitting device can be obtained. These light-emitting materials can properly be selected from among the above-exemplified ones. For example, a white light-emitting device showing a high light-emitting efficiency and a high light-emitting luminance can be obtained by selecting a styrylbenzene derivative as a blue light-emitting material, an orthometallated complex of tris (2-phenylpyridine) iridium complex as a green light-emitting material, and a pyran derivative such as DCM as a red light-emitting material.

The light-emitting layer preferably contains the orthometallated complex in an amount of 0.1 mass % to 50 mass %.

Structure of the light-emitting device of the invention is not particularly limited as long as it comprises a substrate having provided thereon at least an anode, at least an organic compound layer including a light-emitting layer, and a cathode, with the organic compound layer including the light-emitting layer.

For example, the organic compound layer may have a single-layered structure layer composed of the light-emitting layer alone, a two-layered structure composed of a hole transporting layer/a light-emitting layer or composed of a light-emitting layer/an electron transporting layer, or a three-layered structure composed of a hole transporting layer/a light-emitting layer/an electron transporting layer. Further, a hole injecting layer, a hole blocking layer or an electron injecting layer may be provided. In addition, the light-emitting layer may be composed of a single layer or may be composed of a first light-emitting (sub)layer, a second light-emitting (sub) layer, a third light-emitting (sub) layer, etc.

The light-emitting layer of the invention contains two or more different kinds of light-emitting materials, and they may be contained as a mixture in the same light-emitting layer or, when the light-emitting layer is composed of two or more (sub) layers, the light-emitting materials may be incorporated in the different (sub)layers, respectively.

In addition, the light-emitting layer may be a doped light-emitting layer in which a color-emitting material is dispersed in a host material or a non-doped light-emitting layer which contains a light-emitting material as a main component.

Structure and preparation method of the light-emitting device of the invention are described in detail below.

The substrate (support) to be used in the invention may be transparent or opaque. When a transparent substrate is employed, the structure of the light-emitting device may be, for example, a structure of a transparent substrate/an anode/an organic compound layer/a cathode. When an opaque substrate is employed, the structure of the light-emitting device may be, for example, an opaque substrate (optionally functioning as a cathode as well)/a cathode/an organic compound layer/an anode (transparent). In both cases, it suffices that emitted light can exit from the transparent anode side. Detailed descriptions are given below by reference to the case of using a transparent substrate.

As the transparent substrate, there may be illustrated, for example, glass, a polycarbonate sheet, a polyether sulfone sheet, a polyester sheet and a poly(chlorotrifluoroethylene) sheet. In addition, those prepared by forming a protective film of silicon nitride or silicon oxide on these may also be used.

An anode is provided on the transparent substrate. The anode to be used in the invention feeds holes to the organic compound layer and, as the anode material, a metal, an alloy, a metal oxide, an organic conductive compound or a mixture thereof may preferably be used. Preferable examples thereof are those materials which have a work function of 4.0 eV or more. Specific examples thereof include semi-conductive metal oxides such as tin oxide, zinc oxide, indium oxide and indium tinoxide (ITO), metals such as gold, silver, chromium and nickel, mixtures or laminates of the metal and the conductive metal oxide, inorganic conductive materials such as copper iodide and copper sulfide, organic conductive materials such as polyaniline, polythiophene and polypyrrole, and laminates of one of these materials and ITO.

Method for providing the anode is not particularly limited, and there may be illustrated, for example, a wet method such as a printing method or a coating method, a physical method such as a vacuum deposition method, a sputtering method or an ion plating method, and a chemical method such as a CVD method or a plasma CVD method. An optimal method may be selected for a particular anode material. For example, in the case of providing an ITO anode, the sputtering method may be selected, with either a direct current method or an RF method being employable. In the case of providing an organic conductive compound layer, a wet filming method is preferably used.

Thickness of the thus obtained anode may properly be selected depending upon the kind of material but, commonly, thickness in the range of 10 nm to 50 µm is preferred, with thickness of 50 nm to 20 µm being more preferred.

Resistance of this anode is preferably $10^3$ Ω/□ or less, ore preferably $10^2$ Ω/□ or less. Transparency of the anode sheet is preferably 60% or more for taking out fluorescence mainly from the anode side, with 70% or more being more preferred.

On this anode is provided one or more organic compound layers including a light-emitting layer or layers. Total thickness of the organic compound layers is preferably 0.05 µm to 0.3 µm, more preferably 0.07 to 0.2 µm. If the thickness is thinner than this, dielectric breakdown is liable to take place upon applying voltage, thus such thickness being not preferred. If thicker than this, a high voltage is required to cause light emission, thus such thickness being not preferred.

In providing the organic compound layer of the invention, either a wet method such as a coating method or a dry method such as a vapor deposition method or a sputtering method may preferably be employed.

In employing the wet method, a light-emitting material, a hole transporting material or an electron transporting material is mixed in a solvent with a hole transporting polymer or an electron transporting polymer such as a polyvinylcarbazole derivative or a poly(p-phenylenevinylene), and the resulting solution is coated and dried to form the organic compound layer. Alternatively, a light-emitting material, a hole transporting material or an electron transporting material may be mixed in a solvent with an electrically inactive polymer binder such as a polycarbonate resin or a polystyrene resin, and coated, followed by drying, to form the organic compound layer. In addition, each of the above-described layer may be coated, in order, to form a multi-layered structure.

In employing the wet method, the organic compound layer may be obtained by providing, in order, each of the layers through the vapor deposition method or the sputtering method.

As the hole injecting materials or hole transporting materials to be used in the hole transporting layer or the hole injecting layer, any of those which exert one of the function of injecting holes from the anode, the function of transporting holes and the function of blocking electron injected from the cathode may be used with no limitations. There may be illustrated, for example, electrically conductive high molecular oligomers such as carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stylbene derivatives, silazane derivatives, aromatic tertiary amine compounds, styrylamine compounds, aromatic dimethylidene-based compounds, porphy- rin-based compounds, polysilane-based compounds, poly(N-vinylcarbazole) derivatives, aniline copolymers, thiophene oligomers and polythiophene, and high polymer compounds such as polythiophene derivatives, polyphenylene derivatives, polyphenylenevinylene derivatives and polyfluorenone derivatives. These may be used independently or as a mixture of two or more of them.

The light-emitting materials to be used in the light-emitting layer of the invention are as described hereinbefore. The light-emitting layer may contain a host material for transporting exciton energy to the light-emitting material. Such host material is not particularly limited, and there may be illustrated, for example, carbazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene-based compounds, porphyrin-based compounds, anthraquinodimethane derivatives, anthrone derivatives, diphenylquinone derivatives, thiopyran dioxide derivatives, carbodiimide derivatives, fluorenylidenemethane derivatives, distyrylpyradine derivatives, tetracarboxylic acid anhydrides of aromatic rings such as naphthalene and perylene, phthalocyanine derivatives, various metal complexes exemplified by metal complexes of 8-quinolinol derivatives or metal phthalocyanine, or metal complexes containing as a ligand benzoxazole or benzothiazole, polysilane compounds, electrically conductive high molecular oligomers such as poly(N-vinylcarbazole) derivatives, aniline copolymers, thiopheneoligomerorpolythiophene, polythiophenederivatives, polyphenylene derivatives, polyphenylenevinylene derivatives, and polyfluorene derivatives. These may be used independently or as a mixture of two or more of them.

As the electron injecting materials or electron transporting materials to be used in the electron transporting layer or the electron injecting layer, any of those which exert one of the function of injecting electrons from the cathode, the function of transporting electrons and the function of blocking holes injected from the anode may be used with no limitations. There may be illustrated, for example, triazole derivatives, oxazole derivatives, oxadiazole derivatives, fluorenone derivatives, anthraquinodimethane derivatives, anthrone derivatives, diphenylquinone derivatives, thiopyran dioxide derivatives, carbodiimide derivatives, fluorenylidenemethane derivatives, distyrylpyrazine derivatives, tetracarboxylic acid anhydrides of aromatic rings such as naphthalene and perylene, phthalocyanine derivatives, various metal complexes exemplified by metal complexes of 8-quinolinol derivatives or metal phthalocyanine, or metal complexes containing as a ligand benzoxazole or benzothiazole, high molecular compounds such as polythiophene derivatives, polyphenylene derivatives, polyphenylenevinylene derivatives and polyfluorene derivatives. These may be used independently or as a mixture of two or more of them.

In the invention, a cathode is further provided on the organic compound layer.

The cathode to be used in the invention feeds electrons to the organic compound layer. As the materials to be used for the cathode, there maybe used metals, alloys, metal oxides, electroconductive compounds or mixtures thereof. Specific examples include alkali metals (e.g., Li, Na and K) or the fluorides thereof, alkaline earth metals (e.g., Mg and Ca), gold, silver, lead, aluminum, sodium-potassium alloy, lithium-aluminum alloy, magnesium-silver alloy, and rare earth metals such as indium and ytterbium, with those which have a work function of 4.5 eV or less being preferred. More preferred examples include aluminum, lithium-aluminum alloy and magnesium-silver alloy. Thickness of the cathode may properly be selected depending upon the kind of material, but is commonly 10 nm to 5 µm, more preferably 50 nm to 1 µm.

The cathode is formed by various methods depending upon the kind of material. For example, as puttering method, a vacuum vapor deposition method or a coating method may be employed. A single metal maybe vapor deposited, or two or more components may simultaneously be vapor deposited.

In the invention, an electron injecting layer may be provided between the light-emitting layer and the cathode. Examples thereof include metal fluoride such as lithium fluoride and cesium fluoride, and metal oxides such as aluminum oxide.

In addition, in the invention, a protective layer comprising silicon oxide, silicon dioxide, germanium oxide or germanium dioxide may be provided outside the cathode. As the materials for the protective layer, any of those may be used that functions to prevent substances which accelerate deterioration of the device, such as water or oxygen, from coming into the device.

Method for forming the protective layer is not particularly limited, and there may be applied, for example, a vacuum deposition method, a sputtering method, a reactive sputtering method, a molecular epitaxy method, a cluster ion beam method, an ion plating method, a plasma polymerization method, a plasma CVD method, a laser CVD method, a heat CVD method or a coating method.

In cases when an opaque substrate is used, such substrate is exemplified by a plate of metal or alloy such as aluminum, iron, stainless steel or nickel, opaque various plastic substrates and ceramic substrates. When a metal substrate is used, it may also function as a cathode. The light-emitting device of the invention can be obtained by providing on the substrate the aforesaid cathode, the organic compound layer and the anode.

In addition, an electron injecting layer may be provided between the cathode and the light-emitting layer as is the same as described hereinbefore. Further, the protective layer may be provided outside the anode.

The thus obtained light-emitting device may be sealed by a sealing plate or a sealing vessel using a sealing agent for the purpose of preventing contact with outside moisture or oxygen.

As materials to be used for the sealing plate or the sealing vessel, there may be used glass, metals such as stainless steel and aluminum, plastics such as polyester and polycarbonate, and ceramics. As the sealing agent, any of UV ray-curing resins, thermosetting resins and two-pack type setting resins may be used.

Further, in the invention, a moisture absorbent or an inert liquid may be provided in the space between the sealing vessel and the light-emitting device. The moisture absorbent is not particularly limited, but may be exemplified by barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite and magnesium oxide. The inert liquid is not particularly limited, but may be exemplified by paraffins, liquid paraffins, fluorine-containing solvents such as perfluoroalkanes, perfluoroamines and perfluoroethers, chlorine-containing solvents, and silicone oils.

The light-emitting device of the invention having a light-emitting layer containing two or more different kinds of light-emitting materials, with at least one of the light-emitting materials being an orthometallated complex, can be prepared as described above. The light-emitting device can emit light of desired color with a highlight-emitting efficiency and a high light-emitting luminance.

EXAMPLES

The invention is described specifically by reference to Examples which, however, are not limitative at all.

Example 1

An anode (thickness: 0.2 µm) of indium tin oxide (ITO; indium/tin=95/5 molar ratio) was formed on a 25 mm×25 mm×0.5 mm glass-made substrate according to the sputtering method using a direct current source. This anode had a surface resistance of 10 Ω/□.

On this anode was coated a dichloroethane solution containing dissolved therein polyvinylcarbazole/1,1,4,4-tetraphenylbutadiene (blue light-emitting material) tris (2-phenylpyridine) iridium complex (green light-emitting material; orthometallated complex), 4-(dicyanomethylene)-2-methyl-6-(4-dimethylaminostyryl)-4H-pyran (red light-emitting material), 2-(4-biphenylyl)-5-(4-t-butylphenyl)-1,3,4-oxadiazole (electron transporting material) in a weight ratio of 200/1/5/1/50. The thickness of the light-emitting layer was 0.11 µm.

A patterned mask (mask for adjusting light-emitting area to be 5 mm×5 mm) was placed on the organic compound layer, and 0.25-µm thick vacuum deposition of magnesium: silver=10:1 (molar ratio) in a vacuum deposition apparatus, followed by further vacuum depositing silver in a thickness of 0.3 µm to provide a cathode. Aluminum lead wires were connected to the anode and the cathode, respectively, to prepare a light-emitting device.

The thus formed device was placed in a nitrogen gas-replaced globe box, and sealed by a glass-made sealing vessel using a UV ray-curing adhesive (made by Nagase CIBA LTD. LTD. ; XNR5493) to prepare a light-emitting device of the invention.

The light-emitting device was evaluated in the following manner.

A direct current voltage was applied to the organic EL device to emit light using a source measure unit, Model 2400, made by Toyo Technica Co. Maximum luminance was represented as $L_{max}$, and the voltage giving $L_{max}$ was represented as $V_{max}$. Light-emitting efficiency upon 2000 cd/m² was represented as P(cd/A). Results are shown in Table 1. Wavelength of emitted light was measured by means of a spectrum anallizer, PMA-11, made by Hamamatsu Photonics Co. and is also shown in Table 1.

Example 2

A light-emitting device of the invention was prepared in the same manner as in Example 1 except for using as a red light-emitting material bis(2-phenylquinoline)acetylacetonatoiridium complex in place of 4-(dicyanomethylene)-2-methyl-6-(4-dimethylaminostyryl)-4H-pyran (red light-emitting material), and evaluated in the same manner as in Example 1. Results thus obtained are shown in Table 1.

Comparative Example 1

A comparative light-emitting device was prepared in the same manner as in Example 1 except for using as a green light-emitting material coumarin 6 in place of tris(2-phenylpyridin) iridium complex, and evaluated in the same manner as in Example 1. Results thus obtained are shown in Table 1.

Example 3

An anode (thickness: 0.2 μm) of indium tin oxide (ITO; indium/tin=95/5 molar ratio) was formed on a 25 mm×25 mm×0.5 mm glass-made substrate according to the sputtering method using a direct current source. This anode had a surface resistance of 10 Ω/□.

On this anode was coated a 0.04-μm thick hole transporting layer of N,N'-dinaphthyl-N,N'-diphenylbenzidine according to the vacuum vapor deposition.

On this layer was formed a 0.024-μm thick first light-emitting layer by vacuum vapor deposition of 1-[3,5-di(1-pyrenyl)-phenyl]-pyrene (blue light-emitting material) at a rate of 1 nm/sec.

On this layer was formed a 0.024-μm thick second light-emitting layer by vacuum codeposition of a host material of 4,4'-N,N'-dicarbazolebiphenyl and a green light-emitting material of tris (2-phenylpyridine) iridium complex at rates of 3 nm/sec and 0.5 nm/sec, respectively.

On this layer was further formed a 0.024-μm thick third light-emitting layer by vacuum codeposition of a host material of 4,4'-N,N'-dicarbazolebiphenyl and a red light-emitting material of rubrene at rates of 3 nm/sec and 0.1 nm/sec, respectively.

On this layer was further formed a 0.024-μm thick electron transporting layer by vacuum vapor deposition of an electron transporting material of 2,2',2"-(1,3,5-benzenetriyl)tris[3-(2-methylphenyl)-3H-imidazo[4,5-b]pyridine] at a rate of 1 nm/sec.

A patterned mask (mask for adjusting light-emitting area to be 5 mm×5 mm) was placed on the organic compound layer, and 0.25-μm thick vacuum deposition of magnesium:silver=10:1 (molar ratio) was conducted in a vacuum deposition apparatus, followed by further vacuum depositing silver in a thickness of 0.3 μm to provide a cathode. Aluminum lead wires were connected to the anode and the cathode, respectively, to prepare a light-emitting device.

The thus formed device was placed in a nitrogen gas-replaced globe box, and sealed by a glass-made sealing vessel using a UV ray-curing adhesive (made by Nagase CIBA LTD.; XNR5493) to prepare a light-emitting device of the invention.

This was evaluated in the same manner as in Example 1, results being given in Table 1.

Example 4

A light-emitting device of the invention was prepared in the same manner as in Example 3 except for using as a red light-emitting material bis(2-phenylquinoline)acetylacetonatoiridium complex in place of rubrene, and evaluated in the same manner as in Example 1. Results thus obtained are shown in Table 1.

Comparative Example 2

A comparative light-emitting device was prepared in the same manner as in Example 3 except for using as a green light-emitting material coumarin 6 in place of tris(2-phenylpyridine) iridium complex, and evaluated in the same manner as in Example 1. Results thus obtained are shown in Table 1.

TABLE 1

|  | $L_{max}$ (cd/m2) | $V_{max}$ (V) | P (cd/A) | Peak Wavelength of Emitted Light (nm) |
|---|---|---|---|---|
| Example 1 | 23000 | 11 | 18 | 450, 515, 604 |
| Example 2 | 38000 | 10 | 25 | 450, 515, 599 |
| Comparative Example 1 | 2400 | 14 | 1.5 | 450, 520, 603 |
| Example 3 | 56000 | 11 | 38 | 482, 515, 604 |
| Example 4 | 78000 | 10 | 45 | 485, 515, 600 |
| Comparative Example 2 | 5200 | 14 | 2.5 | 482, 516, 605 |

Results shown in Table 1 apparently reveal that, in Examples 1 to 2, light-emitting efficiency (P) upon light emission with high luminance is 10 times as much as, or more than that of, Comparative Example 1 at a lower driving voltage and maximum luminance ($L_{max}$) is also about 10 times as much as that in Comparative Example 1.

Similarly, it is seen that, in Examples 3 to 4, light-emitting efficiency upon light emission with high luminance is 15 times as much as, or more than that of, Comparative Example 2 at a lower driving voltage and maximum luminance is 10 times as much as, or more than that of, Comparative Example 2.

The light-emitting device of the invention comprising a substrate having provided thereon at least an anode, an organic compound layer containing a light-emitting layer or layers, and a cathode, which contains two or more different kinds of light-emitting materials in the light-emitting layer, with at least one of the light-emitting materials being an orthometallated complex shows an excellent light-emitting efficiency and an excellent light-emitting intensity, and is also useful as a white light source.

Although the invention has been described with respect to specific embodiments, the details are not to be construed as limitations, for it will become apparent that various embodiments, changes and modifications may be resorted to without departing from the spirit and scope thereof, and it is understood that such equivalent embodiments are intended to be included within the scope of this invention.

The entire disclosure of each and every foreign patent application from which the benefit of foreign priority has been claimed in the present application is incorporated herein by reference, as if fully set forth above.

What is claimed is:

1. A light-emitting device comprising at least an anode, an organic compound layer containing a light-emitting layer, and a cathode which are provided on a substrate, wherein the light-emitting layer is disposed between the anode and the cathode, and comprises a red light-emitting material having a light-emitting wavelength peak of from 580 to 670 nm, a green light-emitting material having a light-emitting wavelength peak of from 500 to 570 nm, and a blue light-emitting material having a light-emitting wavelength peak of from 400 to 500 nm, and wherein the green light-emitting material comprises at least one green light-emitting material which is an orthometallated complex;
wherein the red light-emitting material comprises at least one red light-emitting material which is an orthometallated complex;
wherein the metal forming the complex for the at least one green light-emitting material which is an orthometallated complex is iridium or platinum;
wherein the metal forming the complex for the at least one red light-emitting material which is an orthometallated complex is iridium;
wherein
(1) the blue, green and red light-emitting materials are contained in the same light-emitting layer, or
(2) the light-emitting layer comprises at least two different light-emitting layers in physical contact with each other, each containing at least one of the blue, green or red light-emitting materials.

2. The light-emitting device as claimed in claim 1, wherein the metal forming the complex for the at least one green light-emitting material which is an orthometallated complex is iridium.

3. The light-emitting device as claimed in claim 2, wherein the ligand forming the complex for the at least one green light-emitting material which is an orthometallated complex is a 2-phenylpyridine derivative.

4. The light-emitting device as claimed in claim 1, wherein the ligand forming the complex for the at least one green light-emitting material which is an orthometallated complex is a 2-phenylpyridine derivative.

5. The light-emitting device as claimed in claim 1, wherein the ligand forming the complex for the at least one red light-emitting material which is an orthometallated complex is a 2-phenylquinoline derivative.

6. The light-emitting device as claimed in claim 1, wherein the blue, green and red light-emitting materials are contained in the same light-emitting layer.

7. The light-emitting device as claimed in claim 1, which emits a white light.

8. The light-emitting device as claimed in claim 1, wherein the light-emitting layer comprises at least two different light-emitting layers in physical contact with each other, each containing at least one of the blue, green or red light-emitting materials.

9. The light-emitting device as claimed in claim 1, wherein the light-emitting layer comprises at least two different light-emitting layers in physical contact with each other, each containing at least one of the green or red light-emitting materials.

10. The light-emitting device as claimed in claim 1, wherein the light-emitting layer comprises at least three different light-emitting layers, each containing only one of the blue, green or red light-emitting materials, with the light-emitting layer containing the green light-emitting material being in physical contact with the light-emitting layer containing the red light-emitting material.

* * * * *